(12) United States Patent
Solomon et al.

(10) Patent No.: US 6,290,774 B1
(45) Date of Patent: Sep. 18, 2001

(54) SEQUENTIAL HYDRIDE VAPOR PHASE EPITAXY

(75) Inventors: Glenn S. Solomon, Redwood City; David J. Miller, Belmont; Tetsuzo Ueda, Menlo Park, all of CA (US)

(73) Assignees: CBL Technology, Inc., Redwood City, CA (US); Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/307,173

(22) Filed: May 7, 1999

(51) Int. Cl.[7] ................................................. C30B 25/14
(52) U.S. Cl. ........................ 117/89; 117/93; 117/102; 117/98; 117/952; 117/956
(58) Field of Search ........................ 117/89, 93, 102, 117/98, 952, 956

(56) References Cited

U.S. PATENT DOCUMENTS

| | | | |
|---|---|---|---|
| 4,246,050 | * 1/1981 | Moon | 117/952 |
| 4,488,914 | * 12/1984 | Quinlan et al. | 156/613 |
| 4,632,712 | * 12/1986 | Fan et al. | 117/952 |
| 5,424,243 | * 6/1995 | Takasaki | 117/89 |
| 5,686,738 | * 11/1997 | Moustakas | 257/103 |
| 5,810,925 | * 9/1998 | Tadatomo et al. | 117/90 |

* cited by examiner

Primary Examiner—Robert Kunemund
(74) Attorney, Agent, or Firm—JDI Patent; Joshua D. Isenberg

(57) ABSTRACT

A method for forming a relatively thick epitaxial film of a III-V compound on a non-native substrate involves sequentially forming a plurality of epitaxial layers on the substrate at a growth temperature. By cooling the substrate and each sequentially grown epitaxial layer to a sub-growth temperature prior to resumption of epitaxial growth, stress within the sample (due to thermal mismatch between the substrate and the epitaxial layer) is periodically relieved. Sequential epitaxial growth is combined with system etching to provide an epitaxial layer which not only has a lower propensity to shatter, but also exhibits improved surface morphology. Sequential hydride vapor-phase epitaxy using HCl as both source gas and etchant, allows integration of sequential deposition and system etching into a single process.

25 Claims, 5 Drawing Sheets

SEQUENTIAL HYDRIDE VAPOR PHASE EPITAXY

BACKGROUND OF THE INVENTION

1. Field of the Invention

The present invention relates to the epitaxial growth of III-V compounds. The present invention also relates to the growth of epitaxial films on a non-native substrate by a sequential deposition process. The invention further relates to the growth of epitaxial films by a process in which the growth system is cleaned repeatedly during epitaxial growth of a film.

2. Background of the Related Art

Hydride vapor-phase epitaxy (HVPE) is an important technique for the epitaxial growth of various semiconductors, such as gallium nitride (GaN). Gallium nitride is emerging as an important technological material. For example, GaN is currently used in the manufacture of blue light emitting diodes, semiconductor lasers, and other opto-electronic devices. The background of the related art will be discussed using deposition of GaN epitaxial layers by HVPE as an example.

In HVPE systems, growth of GaN proceeds due to the high temperature, vapor-phase reaction between gallium chloride (GaCl) and ammonia ($NH_3$). The two gases are directed towards a heated substrate where they meet and react to produce solid GaN on the substrate surface. There are, however, certain difficulties associated with HVPE. For example, the reagent gases can react before reaching the substrate, leading to premature deposition of GaN, i.e. GaN deposition on non-target surfaces. The substrate typically rests on a susceptor which is arranged at an angle with respect to the direction of gas flow (e.g., refer to FIG. 2). The entire susceptor, and not just the substrate, is maintained at the elevated temperatures necessary for deposition to occur. Thus, growth of solid GaN can occur on the susceptor upstream from the substrate. Such upstream GaN deposits have negative consequences for crystal growth on the substrate. Firstly, deposits of solid GaN tend to obstruct proper flow of reagent gases towards the substrate. Also when unwanted GaN deposits accumulate beyond a certain thickness, they tend to merge with the epitaxial layer. Merger of unwanted GaN deposits with the epitaxial layer degrades the uniformity of the GaN epitaxial layer and leads to an inferior product. Further, unwanted GaN deposits that occur upstream can result in particles depositing on the substrate during the epitaxial layer growth, leading to layers with rough surfaces and poor crystalline quality.

According to prior art methods for forming thick layers of GaN on a substrate, excessive deposition on the susceptor stage can reach problematic levels during growth of the GaN film. However, by repeatedly interrupting the growth cycle and forming epitaxial layers sequentially on the substrate, unwanted deposits may be removed from the susceptor and other system components, in situ, by removing the sample and passing an etchant gas through the reactor. While sequential epitaxial growth is more time-consuming, it provides an epitaxial layer having improved surface morphology.

Furthermore, the repeated interruption of the growth cycle (which is a feature of such sequential epitaxial growth) has the added advantage of solving a second drawback to epitaxial deposition of GaN by HVPE. It is currently impossible to fabricate bulk GaN crystals of usable size as substrates in semiconductor manufacturing. Thus, GaN films are made by deposition on a non-native substrate material. However, a thermal mismatch exists between the non-native substrate and the GaN layer. After epitaxial growth of a layer of GaN is complete, the sample must be removed from the HVPE reactor. This involves cooling the sample from the growth temperature to ambient temperature. During cooling, thermal mismatch between the substrate and the epitaxial layer causes stress to develop in the sample. In the case of a relatively thick GaN layer, the entire sample often shatters into small, unusable pieces. By sequentially forming a number of relatively thin epitaxial layers and allowing the sample to cool between deposition of each layer, stress due to thermal mismatch is dissipated periodically, thereby preventing shattering of the entire sample. Thus, sequential epitaxial growth according to the invention also solves the prior art problem of disintegration of epitaxial films grown on non-native substrates.

U.S. Pat. No. 4,632,712, and its continuation U.S. Pat. No. 5,091,333, both to Fan et al. disclose a method for reducing dislocations in semiconductors, in which growth of a semiconductor is interrupted and thermal cycling is used to trap dislocations in the initial stages of epitaxial growth, thereby reducing dislocation densities in the active top layer. Dislocations may be trapped by cooling or by heating the deposited portion, or by a combination of heating and cooling.

U.S. Pat. No. 5,424,243 to Takasaki discloses a method of forming a compound semiconductor structure in which a stacked amorphous layer of a group III-V compound is subjected to a cyclic annealing process. The annealing process causes crystal defects existing in a GaAs crystal layer to move to, and be absorbed by, an amorphous GaAs layer.

U.S. Pat. No. 5,686,738 to Moustakas discloses a method of preparing GaN single crystal films by molecular beam epitaxy. Growth occurs via a two step process using a low temperature nucleation step (at 100–400° C.) and a high temperature growth step (at 600–900° C.).

U.S. Pat. No. 4,246,050 to Moon discloses liquid phase epitaxy for growing a lattice matched layer of GaAsSb on GaAs substrates through a grading layer of AlGaAsSb. Dislocation defects are more evenly distributed over the surface of the growing layer by a step cooling procedure.

SUMMARY OF THE INVENTION

The present invention provides a method for sequential epitaxial growth of a III-V compound, such as GaN. According to one embodiment, a method is provided which involves growing a relatively thin layer of GaN at the normal growth temperature; cooling the sample to a lower, or sub-growth, temperature; heating the sample again to the growth temperature; and repeating these steps until the desired thickness of GaN is formed. A sample having a thin epitaxial layer develops less stress during cooling than does a sample having a much thicker epitaxial layer. Using sequential deposition according to the invention, stress tends to be relieved as small fissures in the epitaxial layer, thereby preventing the entire sample from shattering. In other words, by allowing the stress due to thermal mismatch between the sample and the epitaxial layer to be relaxed periodically, catastrophic destruction of the sample is avoided. At the same time, the interruption of epitaxial growth allows the system components to be cleaned after deposition of each layer. As a result, surface morphology of relatively thick samples is much improved.

Thus, according to the present invention, there is provided a method of growing thick epitaxial layers of GaN and related materials while simultaneously avoiding two problems: 1) degradation of surface morphology due to unwanted deposition of material upstream from the substrate, and 2) sample destruction due to thermal mismatch between the epitaxial material and the substrate. One feature of the invention is that it combines sequential epitaxial deposition with periodic system etching. In brief, growth of thick epitaxial layers may be achieved according to the invention by taking the following steps: (1) growing a relatively thin epitaxial layer by HVPE at the growth temperature; (2) cooling of the sample to a sub-growth temperature; (3) optionally, removing the sample from the reactor; (4) if the sample has been removed, cleaning the reactor by passing an etchant gas therethrough; and, (4) repeating the preceding steps until the desired total thickness of the epitaxial film is formed.

The process outlined above incorporates the positive features of system-cleaning and sequential deposition as a single integrated HVPE procedure. The method of the invention prevents the shattering of the sample by intermittently relieving stress; while surface morphology is improved due to periodic removal of unwanted deposits. System etching using HCl and sequential epitaxial growth may be integrated into a single procedure, since HCl is already used as source gas for the system (FIG. 1). Thus, the method of the invention can be performed using a standard HVPE system. As an added advantage of the invention, the system is cleaned as part of the epitaxial growth process, thereby eliminating the need for expensive and hazardous manual cleaning of the system by personnel.

In view of the above, it is an object of the present invention to provide a method for sequential hydride vapor-phase epitaxial growth of a III-V compound.

One feature of the invention is that it provides a sequentially grown epitaxial film. Another feature of the invention is that it provides a sequential HVPE process which is integrated with periodic system etching. Another feature of the invention is that it provides a method of growing a relatively thick epitaxial film by HVPE, wherein the HVPE system is cleaned between successive epitaxial depositions. One advantage of the invention is that it provides a relatively thick epitaxial film having a uniform surface. Another advantage of the invention is that it provides a method of forming an epitaxial film by HVPE on a non-native substrate, wherein the sample has a low propensity to shatter. Another advantage of the invention is that it provides an epitaxial film having improved surface morphology.

These and other objects, advantages and features are accomplished by the provision of a method of sequential epitaxial growth of a III-V compound to provide an epitaxial film, including the steps of: a) arranging a substrate within a HVPE reactor; b) forming, by HVPE at a growth temperature, an epitaxial layer on the substrate to provide a III-V/substrate sample; c) removing the III-V/substrate sample from the reactor; d) passing an etchant gas through the HVPE reactor to remove solid deposits from the HVPE reactor; e) arranging the III-V/substrate sample within the HVPE reactor; f) forming, by HVPE at the growth temperature, an epitaxial layer on the III-V/substrate sample; g) successively repeating said steps c) through f) until the epitaxial film has attained a desired thickness; and h) cooling the epitaxial film to ambient temperature, wherein the epitaxial film remains entire when cooled to ambient temperature.

These and other objects, advantages and features are accomplished by the provision of a sequentially formed epitaxial film, prepared according to the method of: a) arranging a substrate within a HVPE reactor; b) forming, by HVPE at a growth temperature, an epitaxial layer on the substrate to provide a III-V/substrate sample; c) removing the III-V/substrate sample from the reactor; d) passing an etchant gas through the HVPE reactor to remove solid deposits from the HVPE reactor; e) arranging the III-V/substrate sample within the HVPE reactor; f) forming, by HVPE at the growth temperature, an epitaxial layer on the III-V/substrate sample; and g) successively repeating said steps c) through f) until the epitaxial film has attained a desired thickness.

These and other objects, advantages and features of the invention will be set forth in part in the description which follows and in part will become apparent to those having ordinary skill in the art upon examination of the following, or may be learned from practice of the invention. The advantages of the invention may be realized and attained as particularly pointed out in the appended claims.

DETAILED DESCRIPTION OF THE PREFERRED EMBODIMENTS

For purposes of illustration, the invention will be described primarily in relation to the sequential formation, by HVPE, of a GaN epitaxial layer on a non-native substrate. However, it is to be understood that the invention is also applicable to the deposition of materials other than GaN.

Figure 1:
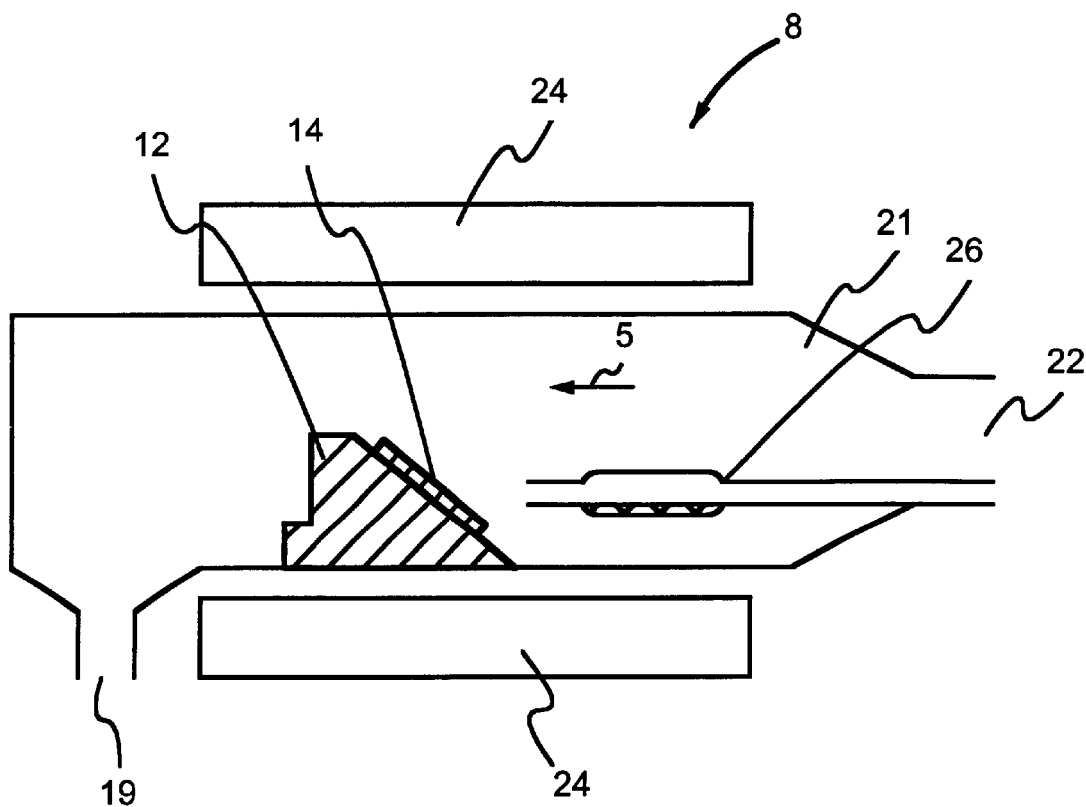
FIG. 1 schematically represents a HVPE system suitable for forming an epitaxial layer.

Referring now to the drawings, FIG. 1 schematically represents a HVPE system 8 suitable for forming epitaxial layers (e.g., 2, 4, 5) on a non-native substrate (e.g., 1) (FIGS. 3A–3E). HVPE systems (e.g., 8) suitable for forming epitaxial layers are well known in the art. Briefly, system 8 includes a growth tube or reactor 21 having inlet 22, outlet 19, and a reaction assembly 26. System 8 may be contained entirely within a furnace 24 for raising the temperature of the reactor. A substrate 14 is arranged on a stage 11 of a susceptor 12 (FIG. 2).

Epitaxial deposition on substrate 14 proceeds by the vapor-phase reaction of reagent gases which are introduced into reactor 21. For example, a reagent gas, such as gallium chloride, indium chloride, or aluminum chloride, may be projected towards substrate 14 from reaction assembly 26; while ammonia may be introduced into growth tube 21 through reactor inlet 22. Reagent gas, e.g. GaCl, may be formed in reaction assembly 26 by passing HCl over liquid metal (e.g., gallium). The direction of gas flow is indicated by arrow 5. Reagent gases (e.g., GaCl, InCl, AlCl) react with ammonia within growth tube 21 to form the respective nitride, GaN, InN, AlN or alloy thereof, which is deposited on substrate 14.

Figure 2:
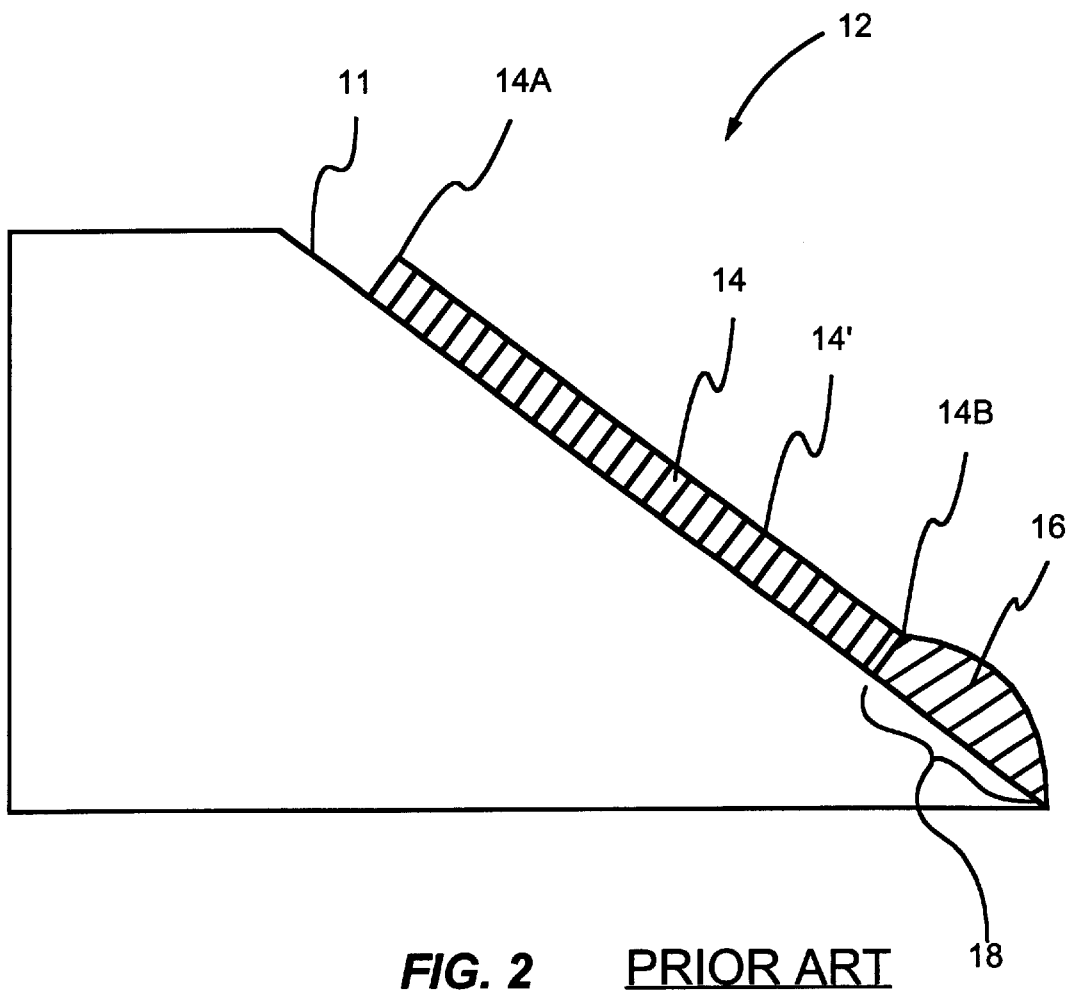
FIG. 2 schematically represents a susceptor of the HVPE system of FIG. 1.

FIG. 2 schematically represents susceptor 12 of HVPE system 8 of FIG. 1. Substrate 14 is arranged on stage 11.

Stage 11 is disposed at an angle with respect to the direction of reagent gas flow (represented by the arrow) 5. This angled arrangement of stage 11 increases the contact area of gas stream 5 with surface 14' of substrate 14. Substrate 14 includes a substrate upper and lower edge 14a, 14b, respectively. Susceptor 12 includes a region 18 upstream from substrate 14 on which source gases impinge before reaching substrate 14. The elevated temperature of susceptor 12 (e.g., between 700 and 1000° C.) allows reagent gases to react on any surface of susceptor 12. In particular, deposition of a solid material 16 at location 18, upstream from substrate 14, is particularly problematic. At region 18, the concentration of reagents in the incident gas stream 5 is maximal. During HVPE by prior art methods, deposits 16 interfere with the free flow of reagent gases 5. In addition, deposits 16 can merge with the epitaxial layer, for example, at substrate lower edge 14b, leading to degradation of surface morphology of the epitaxial layer. Also, unwanted deposition of GaN may cause accumulation of particles on the substrate during deposition growth steps leading to epitaxial layer with poor surface quality. The instant invention overcomes problems associated with unwanted deposits, e.g., 16, on susceptor 12, and on other components of system 8, as will be described with reference to FIGS. 3A–D, 4, and 5.

Figure 3A:
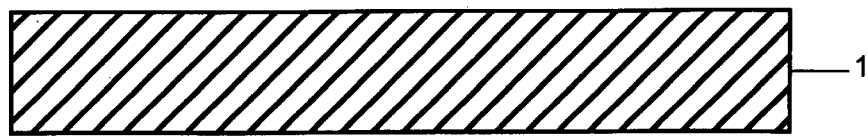
FIGS. 3A, 3B, 3C, 3D, and 3E represent stages in formation of an epitaxial film, according to the invention.
Figure 3B:
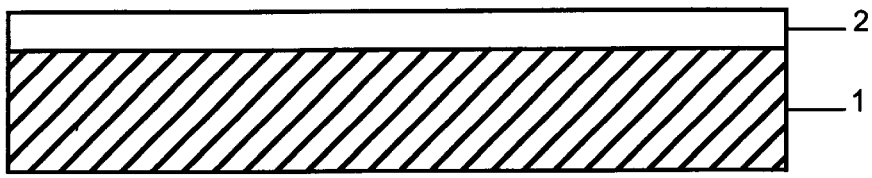

FIGS. 3A, 3B, 3C, 3D, and 3E represent stages in the formation of an epitaxial film, according to one embodiment of the invention. FIG. 3A represents a non-native substrate 1. According to the invention, substrate 1 is preferably sapphire, silicon, silicon carbide, gallium arsenide, zinc oxide or magnesium oxide. FIG. 3B represents a first, relatively thin epitaxial layer 2 formed on substrate 1. According to the invention, layer 2 is formed on substrate 1 by HVPE, at a normal growth temperature, typically between 700 and 1100° C. Layer 2 may be deposited on substrate 1 to a thickness in the range of from 15 to 75 microns; more preferably from 20 to 50 microns; and more preferably to a thickness of 25 microns. Herein, substrate 1 having any number of epitaxial layers (e.g., 2, 4, 5) deposited thereon may be referred to as a "III-V/substrate sample", or more conveniently as a "sample".

According to the invention, after formation of layer 2 to the desired thickness, HVPE growth is discontinued or interrupted, and the reactor, and concomitantly the sample, is allowed to cool to a sub-growth temperature. Preferably, the sample is allowed to cool slowly. A preferred rate of cooling is between 1 to 100° C./min, and most preferably between 10 to 25° C./min.

Figure 3C:
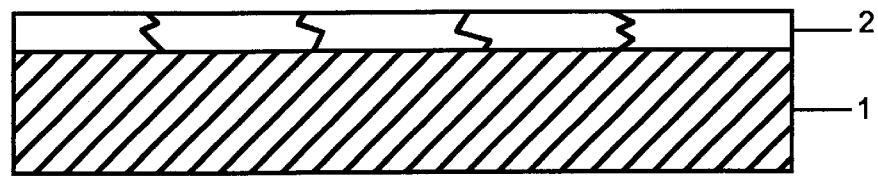

FIG. 3C represents a sample which has been cooled to a sub-growth temperature. During cooling, stress develops in the sample due to thermal mismatch (i.e., differences in coefficient of thermal expansion) between layer 2 and substrate 1. Typically, such stress leads to the development of small fissures 3 in the epitaxial layer (e.g., layer 2). After cooling to a suitable sub-growth temperature, the structure of FIG. 3C is again heated to the growth temperature in the reactor (e.g., reactor 21, FIG. 1).

Figure 3D:
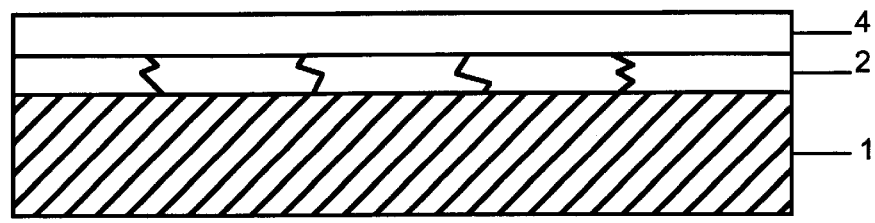
Figure 3E:
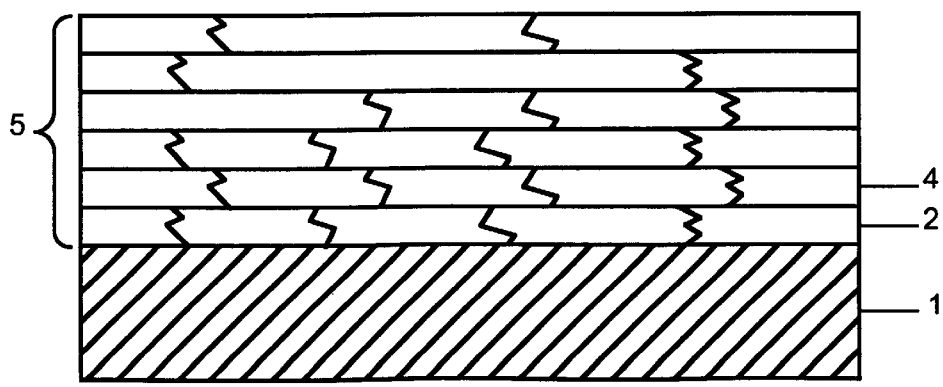

FIG. 3D represents a sample on which an additional, relatively thin epitaxial layer 4 is formed on layer 2. Layer 4, and each subsequently deposited epitaxial layer, may have a thickness as described for layer 2, hereinabove. After formation of layer 4, the reactor and sample is again cooled to a sub-growth temperature. Thereafter, the sample is heated once more to the growth temperature, and a further relatively thin epitaxial layer is formed on the sample. This sequence of epitaxial deposition at the growth temperature, followed by cooling to a sub-growth temperature may be repeated until a multi-layered film 5 has been formed on substrate 1, as is shown in FIG. 3E. Although a total of six epitaxial layers are shown in FIG. 3E as comprising film 5, this is not to be construed as limiting the invention as to the number of layers that may be sequentially deposited.

Because, each epitaxial layer is relatively thin, and stress is relieved after each layer has been deposited, the sample does not shatter when it is finally cooled, e.g., to ambient temperature. In addition, the strain due to thermal mismatch generated in each newly formed layer decreases as the total number of layers increases. As a result, after a sufficient number of layers have been deposited, fissures no longer form in the uppermost layer(s), and the epitaxial film has a uniform surface. According to a currently preferred embodiment of the invention, film 5 comprises a nitride of gallium, indium, aluminum, or one of their alloys. Most preferably, film 5 is gallium nitride and the total thickness of the film 5 is preferably in the range of 100 to 500 microns.

After each layer (e.g., 2, 4) has been formed, epitaxial growth is curtailed, and the reactor and sample are cooled, as described hereinabove. According to one embodiment of the invention, the sample may be removed from the reactor after each sequence of epitaxial growth, and HVPE system 8 may be cleaned by passing etchant gas through reactor 21 at an elevated temperature (e.g., the growth temperature). In particular, by passing HCl through reactor 21 after each sequence of growth, excessive deposits 16 do not build up on susceptor stage 11. As a result, the sample is not impaired due to contact with unwanted deposits 16, and a high quality surface morphology of the sample is assured. As described with reference to FIG. 1, HCl is already used in conjunction with system 8 for epitaxial growth of III-V nitrides, so that system etching can be readily performed using a standard (unmodified) HVPE system. After etching has been completed, system 8 may be cooled down and the sample reintroduced for deposition of another epitaxial layer of film 5.

Figure 4:
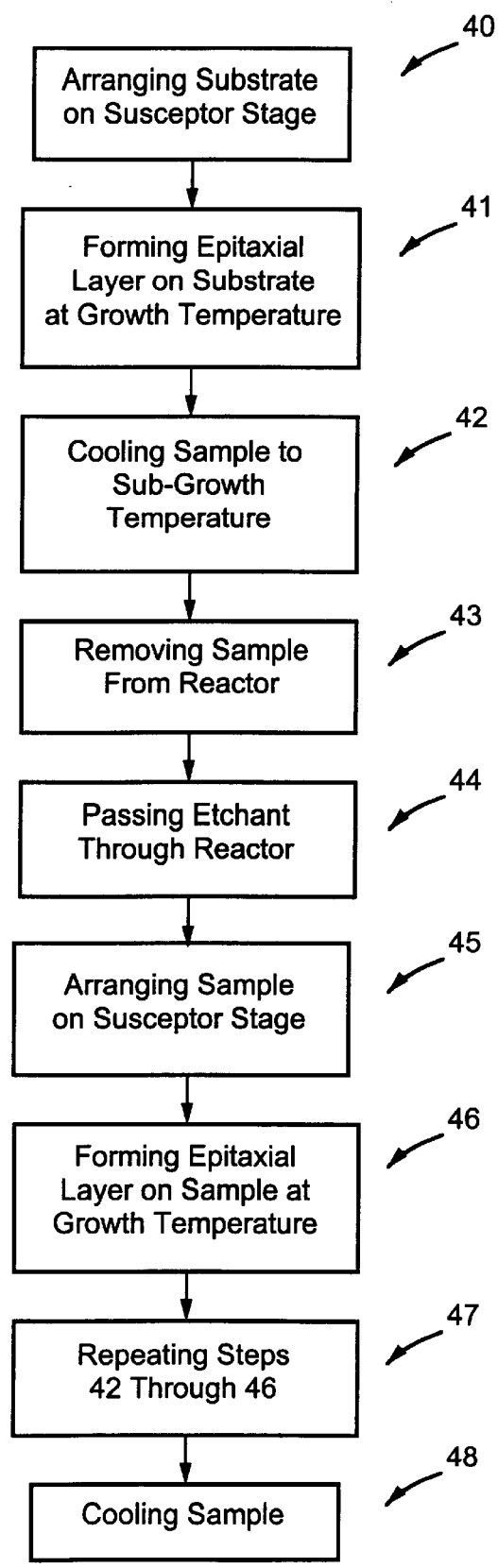
FIG. 4 schematically represents a series of steps involved in a method of forming an epitaxial film, according to the invention.

FIG. 4 schematically represents a series of steps involved in a method of forming an epitaxial film, according to the invention, in which step 40 involves arranging a substrate in a HVPE reactor. Preferably, the substrate is arranged on a susceptor stage (FIG. 2) within the reactor. The substrate provided in step 40 is preferably a non-native substrate, such as sapphire, silicon, silicon carbide, gallium arsenide, zinc oxide or magnesium oxide. Step 41 involves forming a first epitaxial layer of a III-V compound (e.g., gallium nitride) on the substrate to provide a III-V/substrate sample. The epitaxial layer may be formed on the substrate by HVPE at a growth temperature in the range of from 700 to 1100° C. The epitaxial layer formed in step 41 preferably has a thickness in the range of from 15 to 100 microns; more preferably from 20 to 50 microns; and most preferably 25 microns.

Step 42 involves cooling the epitaxial layer formed in step 41 to a lower, or sub-growth, temperature. In this step (step 42), the heat source for the HVPE system (e.g., furnace 24, FIG. 1) may be turned down or turned off. Preferably, the sub-growth temperature is not more than 50% of the growth temperature for epitaxial deposition. For example, where the growth temperature is 1000° C., the sub-growth temperature is preferably not more than 500° C. More preferably, the sub-growth temperature is in the range of 10 to 200° C.; and most preferably, in the range of from ambient temperature to 100° C.

Step 43 involves removing the sample from the HVPE reactor. After, the sample has been removed from the reactor, step 44 involves passing an etchant gas through the reactor while the reactor is held at an elevated temperature, e.g., 1000° C., by the furnace. A preferred etchant gas is HCl. By passing an etchant gas through the reactor, unwanted deposits, which can adversely affect the quality of the epitaxial film, are removed from the HVPE reactor. In particular, step 44 serves to remove excessive deposits, e.g., of GaN, from the susceptor stage located upstream from the substrate/sample. After unwanted deposits have been removed from the HVPE rector by the etchant gas, the reactor is cooled prior to step 45.

Step 45 involves arranging the sample on the susceptor stage within the reactor. Thereafter, step 46 involves forming a further epitaxial layer, on the sample, at an elevated (growth) temperature. The epitaxial layer formed in step 46 may be the same or substantially the same as the first epitaxial layer formed in step 41.

Step 47 involves successively repeating steps 42 through 46 until the epitaxial film has attained a desired thickness and quality. Step 47 may involve from one (1) to as many as twenty (20) or more repetitions of steps 42 through 46. Step 48 involves cooling the sample formed in step 47 to ambient temperature. With each successive epitaxial layer formed, stress in that layer due to thermal mismatch becomes less. Consequently, after deposition of an appropriate number of epitaxial layers, fissures no longer form in the upper epitaxial layer(s) and the surface of the epitaxial film is uniform.

Figure 5:
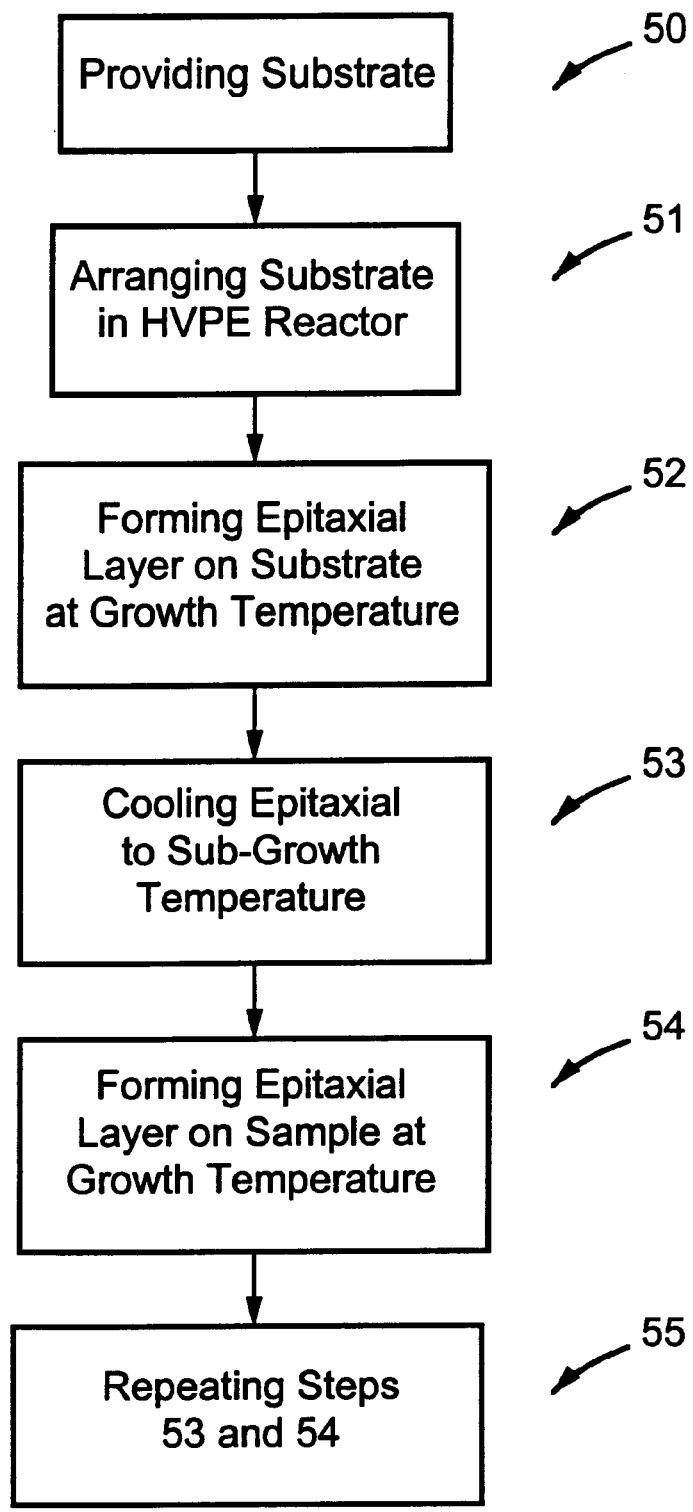
FIG. 5 schematically represents a series of steps involved in a method of forming an epitaxial film, according to another embodiment of the invention.

FIG. 5 schematically represents a series of steps involved in a method of forming an epitaxial film, according to another embodiment of the invention, in which step 50 involves providing a substrate. The substrate provided in step 50 may be of the type described hereinabove (e.g., in step 40, FIG. 4; FIG. 3A). Step 51 involves arranging the substrate in a HVPE reactor (e.g., reactor 21, FIG. 1). Step 52 involves forming an epitaxial layer on the substrate at a growth temperature, essentially as in step 41 described hereinabove (FIG. 4). Step 53 involves cooling the sample to a sub-growth temperature, i.e., to a temperature below the growth temperature, essentially as in step 42 (FIG. 4). Step 54 involves forming an additional epitaxial layer on the sample at the growth temperature, essentially as in step 46 (FIG. 4). Step 55 involves successively repeating steps 53 and 54, until an epitaxial film of the desired thickness and quality is attained.

For purposes of illustration, the invention has been described primarily in relation to the sequential deposition of a GaN epitaxial film. However, the invention is also applicable to sequential deposition of epitaxial layers other than GaN, including nitrides of indium, aluminum, and alloys of Ga, In, and Al.

The foregoing embodiments are merely exemplary and are not to be construed as limiting the present invention. The present teaching may be applied to other types of apparatuses and methods. The description of the present invention is intended to be illustrative, and not to limit the scope of the appended claims. Many alternatives, modifications, and variations will be apparent to those skilled in the art.

What is claimed is:

1. A method for sequential epitaxial growth of a III-V compound on a non-native substrate to provide an epitaxial film, comprising the steps of:
   a) arranging a substrate within a HVPE reactor;
   b) forming, by HVPE at a growth temperature, an epitaxial layer on the substrate to provide a III-V/substrate sample;
   c) removing the III-V/substrate sample from the reactor;
   d) arranging the III-V/substrate sample within the HVPE reactor;
   e) forming, by HVPE at the growth temperature, an epitaxial layer on the III-V substrate sample;
   f) successively repeating steps c) through f) until the epitaxial film has attained a desired thickness; and
   g) cooling the epitaxial film to ambient temperature, wherein the multi-layer epitaxial film remains entire when cooled to ambient temperature.

2. The method of claim 1, wherein said step c) comprises the step of:
   h) interrupting the formation of the epitaxial layer of the III-V compound.

3. The method of claim 1, wherein said step a) comprises arranging the substrate on a susceptor stage within the HVPE, and further comprising after said step c) and prior to said step d) passing an etchant gas through the HVPE reactor until substantially all solid deposits are removed from the susceptor stage.

4. The method of claim 1, further comprising passing an etchant gas through the HVPE reactor.

5. The method of claim 1, wherein the epitaxial film comprises a material selected from the group consisting of gallium nitride, indium nitride, and aluminum nitride.

6. The method of claim 1, wherein the epitaxial layers formed in steps b) and e) each have a thickness in the range of from 15 to 75 microns.

7. The method of claim 1, wherein said f) comprises repeating said steps c) through e) from one (1) time to twenty (20) times.

8. The method of claim 1, further comprising the step of h) prior to said step e), cooling the II-V/substrate sample to a sub-growth temperature.

9. The method of claim 8, wherein the sub-growth temperature is not more than 50% that of the growth temperature.

10. The method of claim 8 wherein the sub-growth temperature is in the range of from 10 to 100° C.

11. The method of claim 8, wherein said step h) comprises creating and relieving stress in at least one epitaxial layer of the III-V/substrate sample, wherein the stress is due to thermal mismatch between the substrate and the III-V compound.

12. The method claim 1, wherein the growth temperature is in the range of from 700 to 1100° C.

13. The method of claim 1, wherein the epitaxial film formed in said step f) has a total thickness in the range of from 100 to 500 microns.

14. The method of claim 1, wherein the substrate comprises a material selected from the group consisting of sapphire, silicon, silicon carbide, gallium arsenide, zinc oxide and magnesium oxide.

15. A method of sequentially forming an epitaxial film of a III-V nitride, comprising the steps of:
   a) providing a substrate;
   b) arranging the substrate in a reactor of a HVPE system;
   c) forming, by HVPE at a growth temperature, a first epitaxial layer of the III-V nitride on the substrate to a thickness in the range of from 15 to 75 microns;
   d) removing from the HVPE reactor, the substrate and the III-V nitride formed thereon;
   e) cooling the substrate and the first epitaxial layer of the III-V nitride to a sub-growth temperature, wherein the sub-growth temperature is not more than 50% that of the growth temperature so that stress relieving defects are propagated in the epitaxial layer;
   f) forming, by HVPE at the growth temperature, an additional epitaxial layer of the III-V nitride on an existing epitaxial layer to provide a plurality of epitaxial layers on the substrate, wherein the additional epitaxial layer has a thickness in the range of from 15 to 75 microns;

g) removing from the HVPE reactor, the substrate and the III-V nitride formed thereon;

h) cooling the substrate and the plurality of epitaxial layers to the sub-growth temperature so that stress relieving defects are propagated in one or more layers of the plurality of epitaxial layers; and i) successively repeating steps e) and f) until the epitaxial film has attained a desired total thickness.

16. The method of claim 15, further comprising the step of:

j) after said steps e) and h), raising the temperature of the substrate and the III-V nitride to the growth temperature.

17. The method of claim 15 further comprising the steps of:

k) after said steps d) and f), and before steps e) and h), interrupting the formation of the epitaxial layer of the III-V nitride.

18. The method of claim 15 further comprising the step of, after said steps d) and g): l) passing an etchant gas through the reactor.

19. The method of claim 18, wherein the etchant gas comprises HCl.

20. The method of claim 15, wherein the substrate comprises a material selected from the group consisting of sapphire, silicon, silicon carbide, gallium arsenide, zinc oxide and magnesium oxide.

21. The method of claim 15, wherein the epitaxial film comprises a material selected from the group consisting of gallium nitride, indium nitride, and aluminum nitride.

22. The method of claim 15 wherein the growth temperature is in the range of from 700 to 1100° C.

23. The method of claim 15, wherein the sub-growth temperature is in the range of from ambient to 100° C.

24. The method of claim 15, wherein the epitaxial film, formed in said step g), has a total thickness in the range of from 100 to 500 microns.

25. The method of claim 4, wherein the etchant gas comprises HCl.

* * * * *

UNITED STATES PATENT AND TRADEMARK OFFICE
CERTIFICATE OF CORRECTION

PATENT NO.     : 6,290,774 B1
DATED          : September 18, 2001
INVENTOR(S)    : Glenn S. Solomon et al.

It is certified that error appears in the above-identified patent and that said Letters Patent is hereby corrected as shown below:

<u>Column 8,</u>
Lines 29-31, claim 8 should read:

-- The method of claim 1, further comprising the step of h) prior to said step e), cooling the III-V/substrate sample to a sub-growth temperature. --

Signed and Sealed this

Thirteenth Day of July, 2004

JON W. DUDAS
*Acting Director of the United States Patent and Trademark Office*